US007552380B2

(12) United States Patent
Park et al.

(10) Patent No.: US 7,552,380 B2
(45) Date of Patent: Jun. 23, 2009

(54) METHOD AND APPARATUS FOR ENCODING AND DECODING MODULATION CODE

(75) Inventors: Jihoon Park, Minneapolis, MN (US); Jaekyun Moon, Minneapolis, MN (US); Jun Lee, Yongin-si (KR)

(73) Assignees: Samsung Electronics Co., Ltd., Suwon-si (KR); Regents of the University of Minnesota, Minneapolis, MN (US)

( * ) Notice: Subject to any disclaimer, the term of this patent is extended or adjusted under 35 U.S.C. 154(b) by 596 days.

(21) Appl. No.: 11/302,381

(22) Filed: Dec. 14, 2005

(65) Prior Publication Data

US 2006/0164263 A1    Jul. 27, 2006

Related U.S. Application Data

(60) Provisional application No. 60/646,646, filed on Jan. 26, 2005.

(30) Foreign Application Priority Data

Mar. 3, 2005    (KR)    ........................ 10-2005-0017665

(51) Int. Cl.
*H03M 7/46* (2006.01)
*H03M 13/09* (2006.01)
*H03M 13/41* (2006.01)

(52) U.S. Cl. ........................... 714/796; 341/59; 341/94; 714/809

(58) Field of Classification Search ................. 714/769, 714/809; 341/59, 94
See application file for complete search history.

(56) References Cited

U.S. PATENT DOCUMENTS

| 3,786,439 | A  | * | 1/1974  | McDonald et al. ......... 714/702 |
| 4,791,643 | A  | * | 12/1988 | Molstad et al. ............ 714/762 |
| 5,220,568 | A  | * | 6/1993  | Howe et al. ............... 714/782 |
| 5,428,627 | A  | * | 6/1995  | Gupta ........................ 714/771 |
| 6,141,787 | A  | * | 10/2000 | Kunisa et al. .............. 714/769 |
| 6,505,320 | B1 | * | 1/2003  | Turk et al. ................. 714/755 |
| 6,587,977 | B1 | * | 7/2003  | Riggle et al. .............. 714/701 |
| 6,631,490 | B2 | * | 10/2003 | Shimoda .................... 714/755 |
| 7,149,955 | B1 | * | 12/2006 | Sutardja et al. ............ 714/809 |
| 7,174,485 | B2 | * | 2/2007  | Silvus ....................... 714/701 |
| 7,245,236 | B2 | * | 7/2007  | Izumita et al. .............. 341/59 |
| 7,269,778 | B1 | * | 9/2007  | Feng et al. ................. 714/758 |
| 7,290,184 | B2 | * | 10/2007 | Bruner et al. .............. 714/704 |
| 7,301,482 | B1 | * | 11/2007 | Oberg ........................ 341/58 |

(Continued)

FOREIGN PATENT DOCUMENTS

CN    1183160 A    5/1998

(Continued)

*Primary Examiner*—Stephen M Baker
(74) *Attorney, Agent, or Firm*—Sughrue Mion, PLLC

(57) ABSTRACT

A method and an apparatus for encoding and decoding a modulation code are provided. The method includes: adding an error detection bit(s) to source information; performing k-constraint coding by inserting an error pattern that can be detected using an error detection code into a data stream that violates a k-constraint for a run length limited (RLL) code in a data stream comprising the error detection bit(s) and the source information, and recording the data stream after being k-constraint coded onto a recording medium; and reading the data stream recorded onto the recording medium and determining whether an error is present in the data stream.

20 Claims, 2 Drawing Sheets

U.S. PATENT DOCUMENTS 7,308,190 B2 * 12/2007 Yen et al. .................. 386/95
7,386,780 B2 * 6/2008 Krachkovsky et al. ...... 714/801
7,397,398 B2 * 7/2008 Jin et al. .................. 341/59

FOREIGN PATENT DOCUMENTS

| CN | 1342979 A | 4/2002 |
| EP | 0706174 A1 | 4/1996 |
| EP | 0821360 A1 | 1/1998 |

* cited by examiner

METHOD AND APPARATUS FOR ENCODING AND DECODING MODULATION CODE

CROSS-REFERENCE TO RELATED PATENT APPLICATIONS

This application claims the benefit of U.S. Provisional Patent Application No. 60/646,646, filed on Jan. 26, 2005, in the U.S. Patent and Trademark Office and the benefit of Korean Patent Application No. 10-2005-0017665, filed on Mar. 3, 2005, in the Korean Intellectual Property Office, the disclosures of which are incorporated herein in their entirety by reference.

BACKGROUND OF THE INVENTION

1. Field of the Invention

The present invention relates to a method and apparatus for encoding and decoding a modulation code. More specifically, the invention relates to a method and apparatus for encoding and decoding a modulation code so that a data stream to be recorded onto a recording medium satisfies run length limiting k-constraints.

2. Description of the Related Art

For a modulation code, a run length limited (RLL) code is used so that a data stream to be recorded onto a recording medium satisfies specified run length limiting constraints. Encoding and decoding of the RLL code are performed according to predetermined rules. The RLL code is represented by (d, k), where "d" indicates the minimum number of consecutive zeros (0) generated between 1 and 1 in a Non Return to Zero Inverted (NRZI) signal and serves to reduce intersymbol interference, and "k" indicates the maximum number of consecutive zeros generated between 1 and 1 and serves to limit a maximum transition interval so that timing information can be extracted within a predetermined period of time. A (0, k) code referred to as a k-constraint code is used as an RLL code in commercial hard disc drives.

The RLL code is essential to system configuration but involves code rate loss according to Shannon's coding theory. As a result, the RLL code limits recording density and deteriorates system performance due to error transmission during decoding.

SUMMARY OF THE INVENTION

Embodiments of the present invention provide methods and apparatus for encoding and decoding a modulation code, by which an error pattern detectable by an error detection code may be inserted into a data stream that does not satisfy run length limiting constraints thereby preventing code rate loss, and by which an error occurring due to the error pattern insertion (i.e., error flip) may be corrected using an error correction mechanism.

According to one aspect of an embodiment of the present invention, methods are provided for encoding and decoding a modulation code which may include adding an error detection bit(s) to source information, performing k-constraint coding by inserting an error pattern that can be detected using an error detection code into a data stream that may include the error detection bit(s) and the source information and that violates a k-constraint for a run length limited (RLL) code, recording the data stream onto a recording medium after being k-constraint coded, and reading the data stream recorded onto the recording medium and determining whether an error may be present in the data stream.

According to another aspect of an embodiment of the present invention, an apparatus is provided for encoding and decoding a modulation code which may include an error detection code encoder for adding an error detection bit(s) to source information, a k-constraint encoder for performing k-constraint coding by inserting an error pattern that can be detected using an error detection code into a data stream that may include the error detection bit(s) and the source information and that violates a k-constraint for a run length limited (RLL) code, a recording medium onto which the data stream may be recorded after being k-constraint coded, and an error detection code decoder for reading the data stream recorded onto the recording medium and determining whether an error may be present in the data stream.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
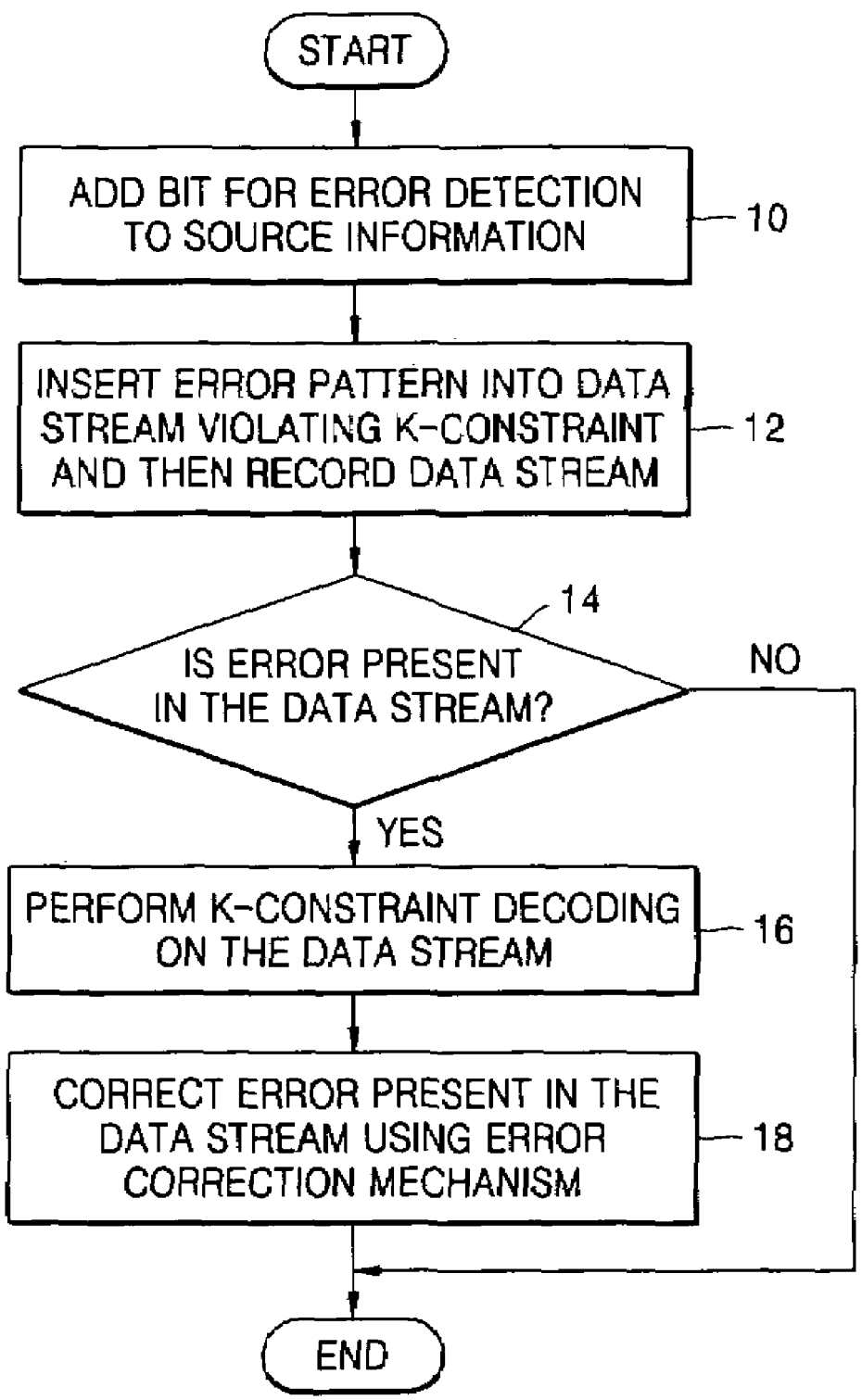
FIG. 1 is a flowchart of a method of encoding and decoding a modulation code according to an embodiment of the present invention.

Hereinafter, exemplary embodiments of the present invention will be described in detail with reference to the attached drawings, wherein the like reference numerals denote the like elements throughout.

FIG. 1 is a flowchart of a method of encoding and decoding a modulation code according to an embodiment of the present invention.

In operation 10, an error detection bit(s) may be added to source information to be recorded onto a recording medium. Either a parity check code (PCC) or a cyclic redundancy check code (CRCC) may be used as an error detection code.

In operation 12, k-constraint coding may be performed by inserting an error pattern that may be detected using an error detection code into a data stream that may include the error detection bit(s) and the source information and that violates a k-constraint (or a maximum run length limiting constraint) for a run length limited (RLL) code, and recording the data stream onto a recording medium after k-constraint coding.

The addition of a redundancy bit(s) is necessary when an RLL code is encoded. Encoding and decoding of the RLL code are performed according to predetermined rules. However, in the present invention, an error pattern that can be detected using an error detection code may be intentionally inserted into a codeword that does not satisfy a k-constraint by flipping bits in the codeword, thereby giving the k-constraint to the codeword. As a result, code rate loss does not occur and only a rule for selecting a bit flip position may be required. A perfect decoding rule, however, does not exist.

According to embodiments of the present invention, decoding may be incorrectly performed by a decoder having no regular rules to follow. However, incorrect decoding does not affect an error rate, and the intentionally inserted error pattern may be corrected by using an error correction mechanism. The error pattern may be a pattern that can be detected using an error detection code and may be inserted into a middle portion of a data stream violating the k-constraint in order to make the resulting data stream compliant to the k-constraint.

Consider, for example, a data stream "01111110" in a Non Return to Zero (NRZ) signal with k=4. When k=4, the number of consecutive zeros (0) or ones (1) available in the NRZ signal is 5. However, in the data stream "01111110" the data stream portion "111111" has 6 consecutive ones (1), thus not satisfying the condition, k=4. In embodiments of the present invention, an error pattern that can be detected using an error detection code may be inserted into the middle portion of the data stream portion in order to convert the data stream portion "111111" into a data stream portion satisfying the k-constraint.

For example, when it is assumed that an error pattern "001100" can be detected using an error detection code, a data stream portion with the inserted error pattern, i.e., a k-constraint coded data stream, will be "110011" (=111111+ 001100). In other words, k-constraint coding may be performed without code rate loss by flipping the bits in a data stream which correspond to the positions of the one (1) bits in an error pattern. As a result, a data stream to be recorded onto a recording medium may intentionally include the error pattern.

In another example, k-constraint coding according to an embodiment of the present invention will be described with respect to a NRZ Inverted (NRZI) signal. Assume that a data stream is "010000010" in the NRZI signal, and k=4. When k=4, the maximum number of consecutive zeros (0) available between 1 and 1 in the NRZI signal is 4. However, a data stream portion "00000" in the data stream "010000010" has 5 consecutive zeros (0), thus not satisfying the condition, k=4. When it is assumed that an error pattern "00110" can be detected using an error detection code, a data stream portion obtained by inserting the error pattern into the middle portion of the data stream portion "00000," i.e., a k-constraint coded data stream portion, will be "00110" (=00000+00110).

As described above, in a procedure for k-constraint coding and data stream recording according to an embodiment of the present invention, an error pattern may be intentionally inserted into a data stream and the data stream containing the error pattern may be recorded. An error caused by bit flip may be corrected by using an error correction mechanism and particularly by using an error event occurring due to the bit flip as a filter in a post-Viterbi error correction mechanism. It can be inferred from the above-described examples that ±[2, 2]=[1, 1] may be an error event filter used in a post-Viterbi error correction mechanism to correct an error caused by intentional bit flip.

In embodiments of the present invention, "k" may be equal to at least 2 for the k-constraint. Simulations indicate that performance achieved when "k" is at least 2 was almost the same as that achieved when k=∞.

In operation 14, the data stream recorded on the recording medium may be read, and then it may be determined whether an error is present in the data stream. An error in the data stream may be the error pattern inserted in operation 12 or an error occurring while the data stream is being read from the recording medium, i.e., an error occurring due to channel distortion. In other words, in operation 14, an error occurring due to channel distortion as well as an error due to error pattern insertion may be detected.

When it is determined that an error is present in the data stream, k-constraint decoding may be performed on the data stream in operation 16. The k-constraint decoding is a reverse operation to the operation of inserting an error pattern into a data stream violating the k-constraint. In the above-described examples, when k=4, the data stream "111111" or "00000" violating the k-constraint is k-constraint coded into "110011" or "00110," respectively. In the k-constraint decoding, the pattern "110011" or "00110" may be found in the data stream and converted into "111111" or "00000," respectively.

Since the k-constraint decoding may be performed based on a pattern matching scheme, the k-constraint decoding may be performed even when the data stream "110011" or "00110" is not a data stream into which an error pattern has been inserted. As a result, improper decoding may be performed. Since k-constraint decoding according to the present invention is not based on a perfect rule, a correct data stream may be improperly decoded. However, an error caused by improper decoding does not affect the performance of a system because an error correction mechanism does not correct an error in the data stream after being k-constraint decoded but corrects an error in the data stream read from the recording medium.

In operation 18, the error correction mechanism may correct the error in the data stream read from the recording medium using the k-constraint decoded data stream. The error in the data stream read from the recording medium may be the error pattern inserted during the coding or an error occurring while the data stream is being read from the recording medium, i.e., an error occurring due to channel distortion. When it is determined that an error is present in the data stream read from the recording medium in operation 14, the error in the data stream may be corrected using the error correction mechanism. The error correction mechanism may perform error correction using the k-constraint decoded data stream. In an embodiment of the present invention, a post-Viterbi error correction mechanism may be used as the error correction mechanism. In particular, an error correction mechanism according to the present invention may correct an error inserted into a series of consecutive zero (0) symbols between symbols of ones (1) or into a series of consecutive one (1) symbols between symbols of zero (0) in a data stream of an NRZ signal or an error inserted into a series of consecutive zero (0) symbols between symbols of ones (1) in a data stream of an NRZI signal.

In operation 18, convolution of the k-constraint decoded data stream and a partial response polynomial may be performed, subtraction between the convolution result and an output of an equalizer may be performed, matched filtering may be performed on the subtraction result, and the error in the data stream read from the recording medium may be corrected using the result of the matched filtering. Here, a matched filter corresponding to the error pattern inserted into the read data stream may be used for the matched filtering.

Hereinafter, an apparatus for encoding and decoding a modulation code according to an embodiment of the present invention will be described with the attached drawings.

Figure 2:
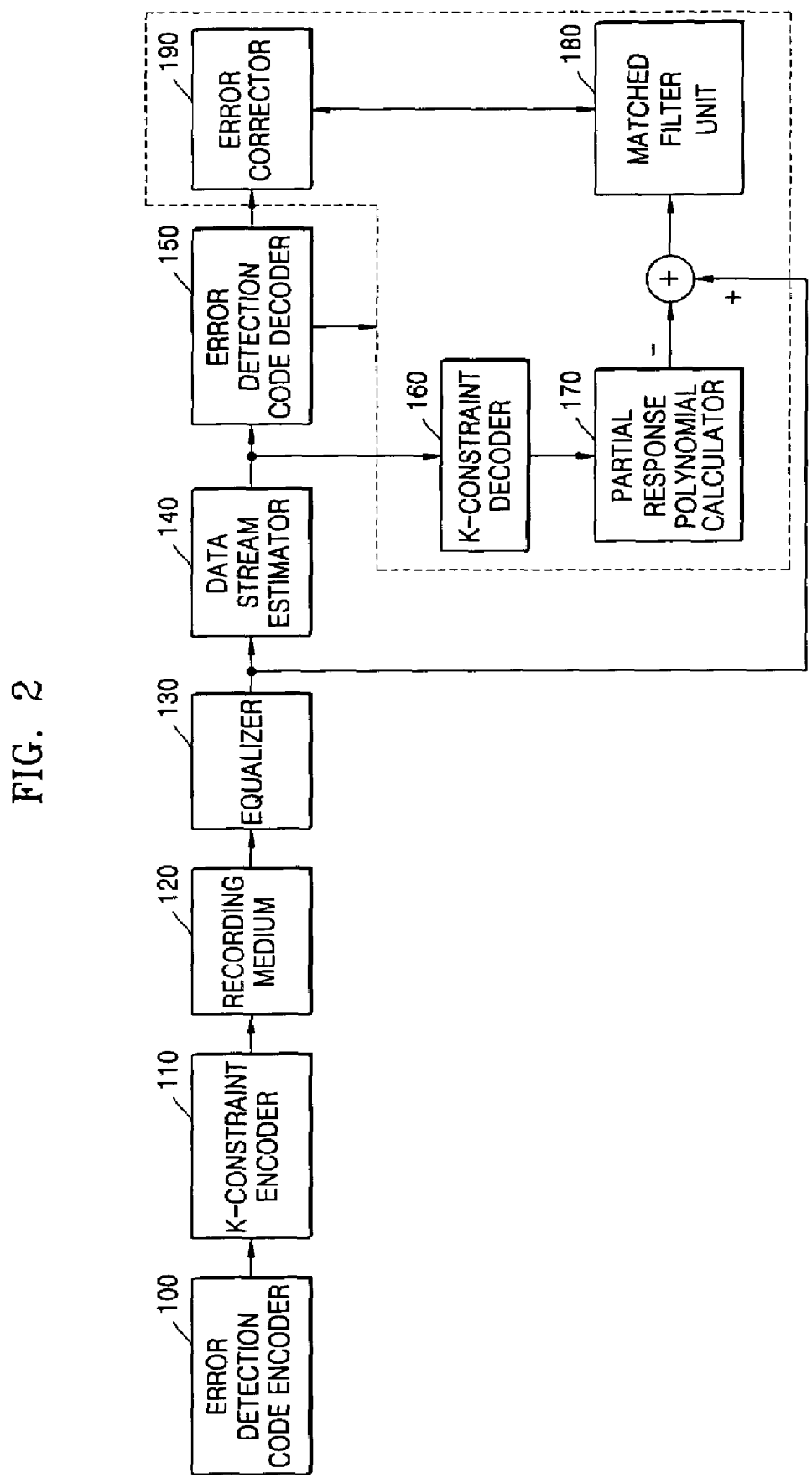
FIG. 2 is a block diagram of an apparatus for encoding and decoding a modulation code according to an embodiment of the present invention.

FIG. 2 is a block diagram of an apparatus for encoding and decoding a modulation code according to an embodiment of the present invention. The apparatus may include an error detection code encoder 100, a k-constraint encoder 110, a recording medium 120, an equalizer 130, a data stream estimator 140, an error detection code decoder 150, a k-constraint decoder 160, a partial response polynomial calculator 170, a matched filter unit 180, and an error corrector 190.

The error detection code encoder 100 may add an error detection bit(s) to source information to be recorded onto the recording medium 120 and may output a data stream with the error detection bit(s) to the k-constraint encoder 110. The error detection code encoder 100 may use a PCC or a CRCC as an error detection code.

The k-constraint encoder 110 may insert an error pattern that can be detected using the error detection code into a data stream that may include the error detection bit(s) and the source information and that violates a k-constraint (or a maximum run length limiting constraint) for an RLL code. Such a process of inserting an error pattern into a data stream violating the k-constraint is referred to as k-constraint coding.

Since the k-constraint encoder 110 may perform the k-constraint coding by flipping some bits in the data stream violating the k-constraint, there is no code rate loss. The k-constraint encoder 110 may insert an error pattern that can be detected using the error detection code used by the error detection code encoder 100. The k-constraint encoder 110 may insert the error pattern into the middle portion of the data stream violating the k-constraint in order to make the resulting data stream compliant to the k-constraint. The k-constraint encoder 110 may insert the error pattern into the data stream violating the k-constraint in a NRZ or NRZI signal. The k-constraint encoder 110 may set "k" of the k-constraint to at least 2 because an error rate obtained when "k" is at least 2 is almost the same as that obtained when k=∞ after error correction is performed.

The data stream output from the k-constraint encoder 110 may be recorded onto the recording medium 120. The recording medium may be any type of recording medium used in a recording system.

The equalizer 130 may remove intersymbol interference from a signal read from the recording medium 120 and may convert the frequency characteristic of a channel to be similar to that of a partial response polynomial.

The data stream estimator 140 may estimate a data stream recorded on the recording medium 120 based on an output signal of the equalizer 130. The estimated data stream may include an error occurring due to channel distortion and an error caused by intentional insertion of an error pattern.

The error detection code decoder 150 may detect an error in the data stream estimated by the data stream estimator 140. If an error is detected by the error detection code decoder 150, then the k-constraint decoder 160, the partial response polynomial calculator 170, the matched filter unit 180, and the error corrector 190 which form an error correction mechanism may operate to correct the error in the data stream. In particular, the error correction mechanism may be implemented as a post-Viterbi error correction mechanism.

The operation of the k-constraint decoder 160 may be determined according to the result of the detection performed by the error detection code decoder 150. The k-constraint decoder 160 may perform k-constraint decoding on the data stream estimated by the data stream estimator 140 in the reverse manner to the k-constraint coding performed by the k-constraint encoder 110.

Since the k-constraint decoder 160 does not perform the decoding operation based on a perfect rule, it may perform improper decoding even when there is no error in a data stream estimated by the data stream estimator 140. Here, the perfect rule indicates that when there is no error in a data stream encoded by the k-constraint encoder 110, the k-constraint decoder 160 restores the input of the k-constraint encoder 110 without errors. However, in embodiments of the present invention, even if the k-constraint decoder 160 performs improper decoding, it does not affect system performance, i.e., an error rate, because the error corrector 190 corrects an error in a data stream estimated by the data stream estimator 140 based on the output of the k-constraint decoder 160.

The partial response polynomial calculator 170 may estimate the output of the equalizer 130 using a data stream decoded by the k-constraint decoder 160. The output of the equalizer 130 may be comprised of ideal partial response signals related with a partial response polynomial.

The matched filter unit 180 may include a plurality of matched filters each configured using a partial response polynomial and an error event that can be detected using an error detection code. An error event may be a main error event of a recording system. A matched filter corresponding to an error event may be implemented by performing convolution of the error event and a partial response polynomial and then performing time reversal. The matched filter unit 180 may include a matched filter corresponding to an error event related to the intentional insertion of an error pattern during k-constraint coding. The input of the matched filter unit 180 may be a difference signal between the output signal of the equalizer 130 and a signal generated by performing convolution of the output signal of the k-constraint decoder 160 and a partial response polynomial.

The error corrector 190 may detect a position of an error in a data stream estimated by the data stream estimator 140 and a type of error event, and correct the error. The error corrector 190 may use a post-Viterbi error correction mechanism to correct the error in the data stream estimated by the data stream estimator 140.

As described above, embodiments of the present invention can accomplish high recording density without code rate loss. In addition, according to embodiments of the a present invention, error transmission does not occur during decoding, and complexity in encoding and decoding is decreased. Moreover, a conventional k-constraint can be implemented so that the present invention provides reliable timing restorability.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of encoding and decoding a modulation code, the method comprising:
   (a) forming a data stream comprising at least one error detection bit and source information;
   (b) if the data stream violates a k-constraint for a run length limited (RLL) code, performing k-constraint coding by inserting an error pattern that can be detected using an error detection code into the data stream, and recording the data stream after being k-constraint coded onto a recording medium;
   (c) reading the data stream recorded onto the recording medium and determining if an error is present in the data stream read from the recording medium;
   (d) if an error is present in the data stream read from the recording medium, performing k-constraint decoding to remove the error pattern intentionally inserted during the k-constraint coding; and
   (e) correcting the error using an error correction mechanism.

2. The method of claim 1, wherein the error detection code is one of a parity check code and a cyclic redundancy check code.

3. The method of claim 1, wherein (b) further comprises inserting the error pattern into a middle portion of the data stream that violates the k-constraint.

4. The method of claim 1, wherein (b) further comprises inserting the error pattern into the data stream violating the k-constraint in one of a Non Return to Zero (NRZ) signal and a Non Return to Zero Inverted (NRZI) signal.

5. The method of claim 1, wherein the k-constraint is at least 2.

6. The method of claim 1, wherein (e) further comprises correcting an error inserted into one of a series of consecutive zero (0) symbols between symbols of ones (1) and a series of consecutive one (1) symbols between symbols of zero (0) in the data stream in a Non Return to Zero (NRZ) signal.

7. The method of claim 1, wherein (e) further comprises correcting an error inserted into a series of consecutive zero (0) symbols between symbols of ones (1) in the data stream in a Non Return to Zero Inverted(NRZI) signal.

8. The method of claim 1, wherein a post-Vitervi error correction mechanism is used to correct the error in the data stream read from the recording medium.

9. The method of claim 8, wherein (e) further comprises:
 (e1) subtracting an output of an equalizer and a result of convolution of the k-constraint decoded data stream with a partial response polynomial and match filtering a result of the subtraction; and
 (e2) correcting the error in the data stream read from the recording medium using the result of the matched filtering.

10. The method of claim 9, wherein (e1) further comprises match filtering using a matched filter corresponding to the error pattern inserted into the data stream.

11. An apparatus for encoding and decoding a modulation code, the apparatus comprising:
 an error detection code encoder configured to combine at least one error detection bit with source information;
 a k-constraint encoder configured to perform k-constraint coding by inserting an error pattern that can be detected using an error detection code into a data stream that violates a k-constraint for a run length limited (RLL) code in a data stream comprising the at least one error detection bit and the source information;
 a recording medium onto which the data stream after being k-constraint coded is recorded;
 an error detection code decoder configured to read the data stream recorded onto the recording medium and determining whether an error is present in the data stream;
 a k-constraint decoder configured to perform k-constraint decoding to remove the error pattern intentionally inserted into the data stream during the k-constraint coding; and
 an error corrector configured to correct the error in the data stream read from the recording medium using an error correction mechanism.

12. The apparatus of claim 11, wherein the error detection code encoder uses one of a parity check code and a cyclic redundancy check code as the error detection code.

13. The apparatus of claim 11, wherein the k-constraint encoder inserts the error pattern into a middle portion of the data stream that violates the k-constraint.

14. The apparatus of claim 11, wherein the k-constraint encoder inserts the error pattern into the data stream violating the k-constraint in one of a Non Return to Zero (NRZ) signal and a Non Return to Zero Inverted (NRZI) signal.

15. The apparatus of claim 11, wherein the k-constraint encoder uses a k-constraint of at least 2.

16. The apparatus of claim 11, wherein the error corrector corrects an error inserted into one of a series of consecutive zero (0) symbols between symbols of ones (1) and a series of consecutive one (1) symbols between symbols of zero (0) in the data stream in a Non Return to Zero (NRZ) signal.

17. The apparatus of claim 11, wherein the error corrector corrects an error inserted into a series of consecutive zero (0) symbols between symbols of ones (1) in the data stream in a Non Return to Zero Inverted(NRZI) signal.

18. The apparatus of claim 11, wherein the error corrector uses a post-Viterbi error correction mechanism to correct the error in the data stream read from the recording medium.

19. The apparatus of claim 18, further comprising a matched filter unit configured to subtract a result of convolution of the k-constraint decoded data stream with a partial response polynomial and an output of an equalizer which removes intersymbol interference from the data stream read from the recording medium, and performing matched filtering of a result of the subtraction,
 wherein the error corrector corrects the error in the data stream read from the recording medium using the result of the matched filtering.

20. The apparatus of claim 19, wherein the matched filter unit comprises a matched filter corresponding to the error pattern inserted into the data stream and performs the matched filtering using the corresponding matched filter.

* * * * *